(12) United States Patent
Zyuban et al.

(10) Patent No.: US 9,871,507 B1
(45) Date of Patent: Jan. 16, 2018

(54) GENERATING AN OVERDRIVE VOLTAGE FOR POWER SWITCH CIRCUITRY

(71) Applicant: Apple Inc., Cupertino, CA (US)

(72) Inventors: Victor Zyuban, Sunnyvale, CA (US); Shingo Suzuki, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/264,365

(22) Filed: Sep. 13, 2016

(51) Int. Cl.
*G05F 3/02* (2006.01)
*H03K 17/16* (2006.01)
*H03K 5/24* (2006.01)

(52) U.S. Cl.
CPC ............ *H03K 17/161* (2013.01); *H03K 5/24* (2013.01)

(58) Field of Classification Search
None
See application file for complete search history.

(56) References Cited

U.S. PATENT DOCUMENTS

| | | | | |
|---|---|---|---|---|
| 7,659,773 B2* | 2/2010 | Choi | .................... | G06F 1/26 327/142 |
| 7,928,797 B2* | 4/2011 | Valentian | .............. | H03K 17/063 327/427 |
| 8,362,800 B2* | 1/2013 | Or-Bach | .............. | H01L 25/0657 326/10 |
| 8,395,440 B2* | 3/2013 | Sandhu | ................ | H03K 17/145 327/540 |
| 8,456,223 B2* | 6/2013 | Myers | ................ | H03K 19/0016 327/534 |
| 8,610,456 B2* | 12/2013 | Chiaburu | ............ | H04L 25/0278 326/21 |
| 8,947,154 B1* | 2/2015 | Shah | ..................... | H03K 17/687 327/427 |
| 9,007,122 B2 | 4/2015 | Lundberg | | |
| 9,467,061 B2* | 10/2016 | Zojer | .................... | H03K 17/687 |
| 2003/0151430 A1* | 8/2003 | Hakkarainen | ......... | H03M 1/165 327/94 |
| 2006/0006929 A1* | 1/2006 | Caplan | ............... | H03K 19/0016 327/546 |
| 2008/0165608 A1* | 7/2008 | Choi | ..................... | G11O 5/145 365/228 |

(Continued)

*Primary Examiner* — Lincoln Donovan
*Assistant Examiner* — Khareem E Almo
(74) *Attorney, Agent, or Firm* — Meyertons, Hood, Kivlin, Kowert & Goetzel, P.C.

(57) ABSTRACT

Techniques are disclosed relating to generating an overdrive voltage for power switch circuitry. In some embodiments, the value of the overdrive voltage is adjusted dynamically in order to reduce leakage current during power gating. In some embodiments, an apparatus includes a power switch circuit element configured to gate power to circuitry in the apparatus based on a control signal. In some embodiments, the power switch circuit element is powered by a supply voltage. In some embodiments, the apparatus also includes control circuitry configured to generate the control voltage at a different voltage level than the supply voltage, based on comparison of leakage current of ones of a plurality of replicas of the power switch circuit element. In some embodiments, the replicas are configured to receive different reference voltages as respective replica control signals. In various embodiments, the disclosed techniques may generate overdrive voltages that reduce leakage current during power gating.

20 Claims, 7 Drawing Sheets

(56) References Cited

U.S. PATENT DOCUMENTS

| | | | |
|---|---|---|---|
| 2012/0200345 A1* | 8/2012 | Kim | H03K 19/0016 327/543 |
| 2013/0027123 A1* | 1/2013 | Idgunji | H03K 19/0016 327/543 |
| 2016/0072485 A1* | 3/2016 | Vice | H03F 1/0255 330/296 |
| 2016/0218046 A1* | 7/2016 | Or-Bach | H03K 3/0375 |

* cited by examiner

GENERATING AN OVERDRIVE VOLTAGE FOR POWER SWITCH CIRCUITRY

BACKGROUND

Technical Field

This disclosure relates generally to power gating and more particularly to using overdrive voltage to control power switch circuitry.

Description of the Related Art

Power consumption is an important design consideration in many circuit applications. Power gating is a common technique for reducing leakage current when circuitry is not being used, reducing overall power consumption. Integrated circuits, for example, are often designed with power switches configured to gate power to portions of the circuit.

The power switches, however, may still have a small leakage current when gated. A common design goal is to reduce the resistive voltage drop of the power switch, which often leads to increasing the size of the transistor used to implement the power switch. To further reduce leakage current, an "overdrive" voltage may be applied to gate terminals of power switch transistors, where the overdrive voltage is at a higher voltage than the supply voltage. Thus may reduce subthreshold leakage current up to a certain point, at which N-well junction leakage begins to outweigh the reduction in subthreshold leakage. Therefore, setting the overdrive voltage too high may actually increase leakage current. Further, due to technology variations, circuit aging, and temperature difference, for example, a fixed overdrive voltage may not be most efficient for different circuits or portions of the same circuit.

SUMMARY

Techniques are disclosed relating to generating an overdrive voltage for power switch circuitry. In some embodiments, the value of the overdrive voltage is adjusted dynamically, using digital control circuitry, in order to reduce leakage current during power gating.

In some embodiments, an apparatus includes a power switch circuit element configured to gate power to circuitry in the apparatus based on a control signal. In some embodiments, the power switch circuit element is powered by a supply voltage. In some embodiments, the apparatus also includes voltage control circuitry configured to generate the control voltage at a different voltage level than the supply voltage, based on comparison of leakage currents of ones of a plurality of replicas of the power switch circuit element. In some embodiments, the replicas are configured to receive different reference voltages as respective replica control signals.

In some embodiments, a voltage generator (e.g., a voltage regulator) is configured to generate the control voltage for the power switch circuit element based on a selected reference voltage. In some embodiments, digital circuitry is configured to select a reference voltage corresponding to a replica that exhibits the lowest leakage current. In some embodiments, voltage ladder circuitry is configured to generate the reference voltages. In some embodiments, comparison circuitry is configured to compare the leakage current, which may be performed directly (e.g., using current sensors and/or comparators) or indirectly (e.g., using voltage sensor and/or comparators).

In various embodiments, the disclosed techniques may dynamically generate overdrive voltages to reduce leakage current during power gating across different devices, circuit portions, operating conditions, etc.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

DETAILED DESCRIPTION

Figure 1:
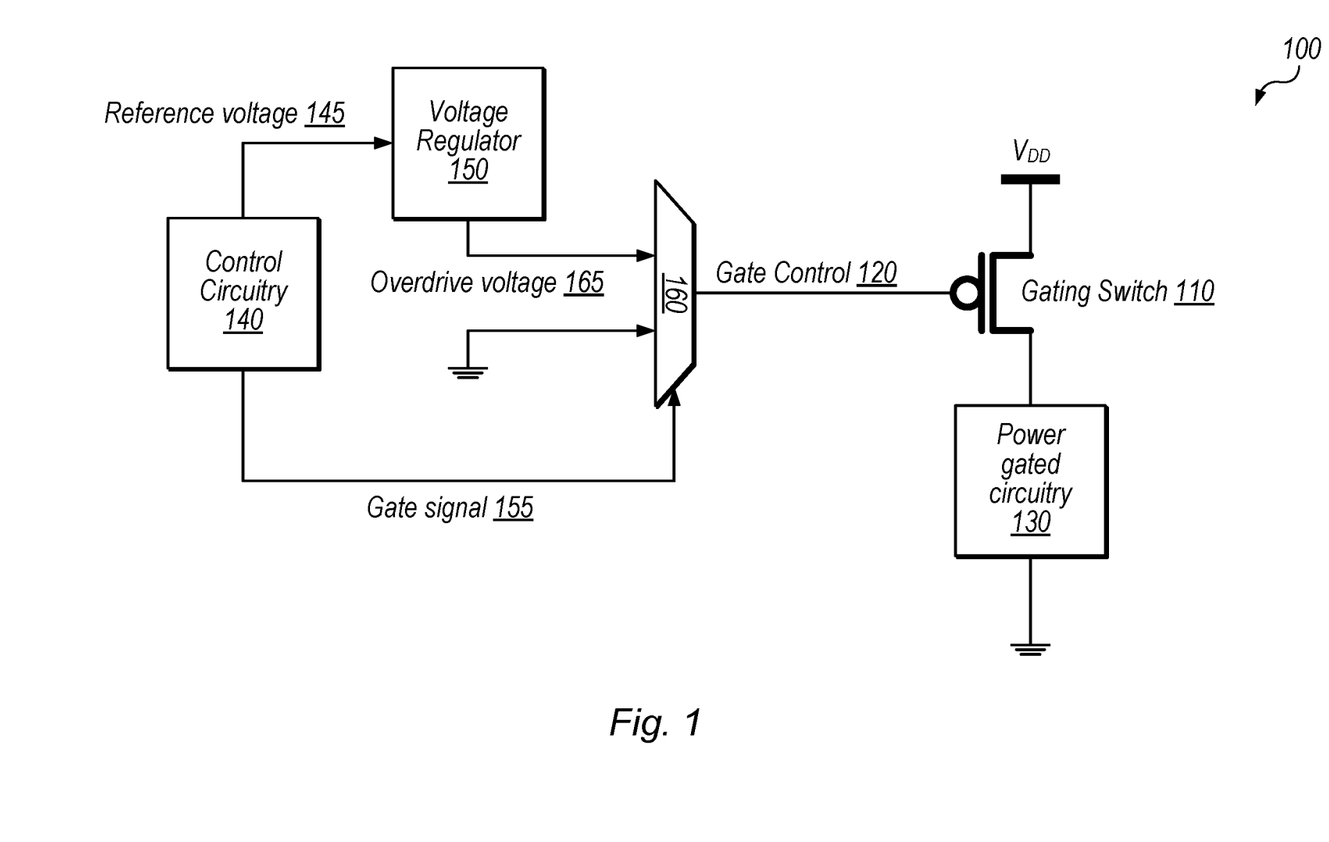
FIG. 1 is a block diagram illustrating an exemplary power gating switch controlled by an overdrive voltage, according to some embodiments.
Figure 2:
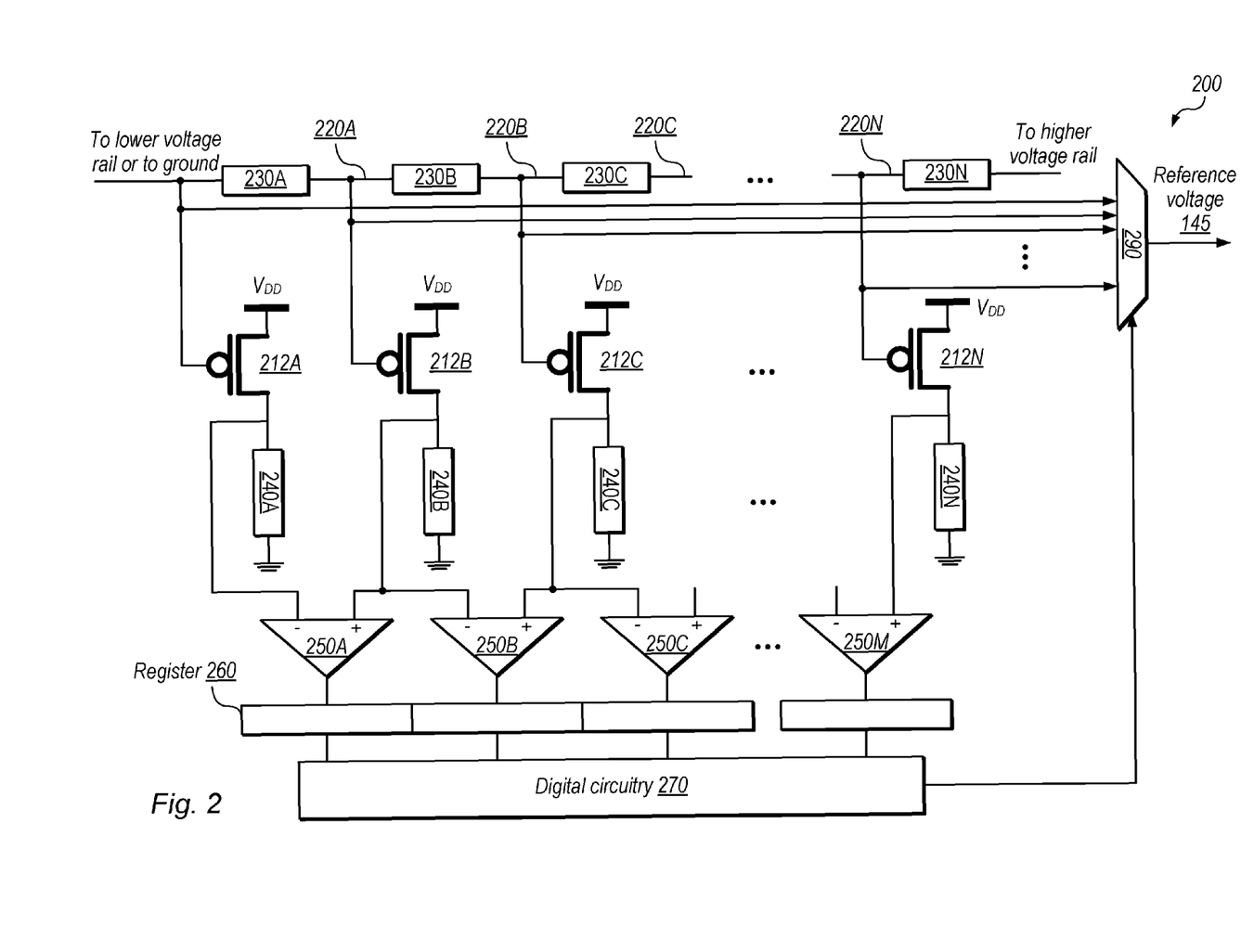
FIG. 2 is a diagram illustrating control circuitry that includes multiple replicas of a power gating switch that are controlled with different reference voltages, according to some embodiments.
Figure 3:
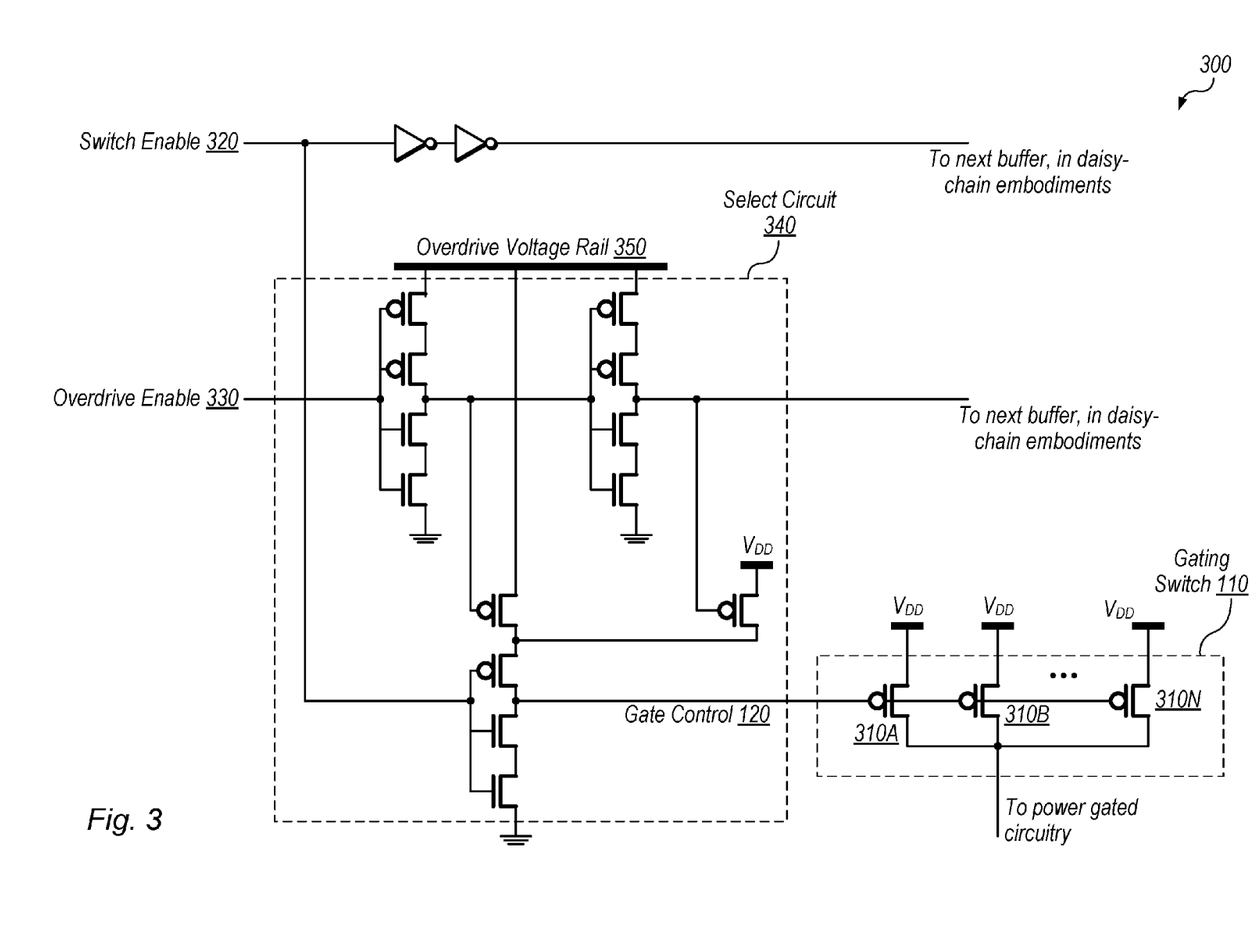
FIG. 3 is a diagram illustrating exemplary buffering circuitry configured to control a gating switch using a selected overdrive voltage, according to some embodiments.
Figure 4:
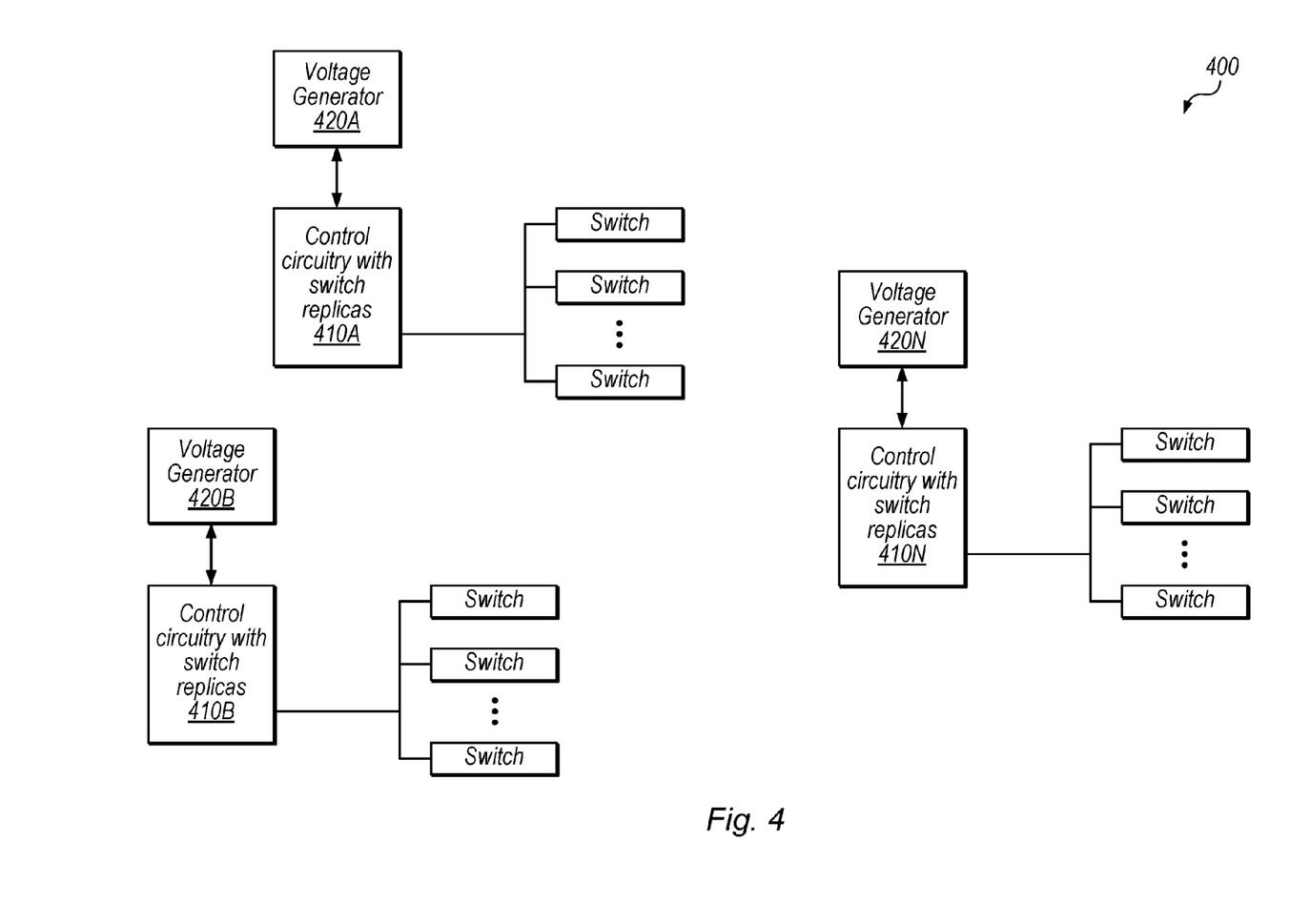
FIG. 4 is a block diagram illustrating an exemplary integrated circuit that includes multiple instances of control circuitry with switch replicas in different locations within the integrated circuit, according to some embodiments.

This disclosure initially describes, with reference to FIG. 1, an overview of power gating techniques and overdrive voltage. FIG. 2 illustrates exemplary control circuitry used to generate an overdrive control voltage for one or more power gating switches, FIG. 3 shows exemplary buffering and overdrive enable circuitry, and FIG. 4 shows multiple instances of control circuitry in the same integrated circuit. An exemplary method, device, and computer-readable medium are described with reference to FIGS. 5-7. In some embodiments, the disclosed techniques generate overdrive voltages that reduce leakage current during power gating across different devices, circuit portions, operating conditions, etc.

Exemplary Power Gating and Adjustable Overdrive Voltage

FIG. 1 is a block diagram illustrating an exemplary circuit 100 that includes a power gating switch, according to some embodiments. In the illustrated embodiment, circuit 100 includes gating switch 110, power gated circuitry 130, control circuitry 140, voltage regulator 150, and MUX 160.

In the illustrated embodiment, control circuitry 140 is configured to operate power gated circuitry 130 in either a gated mode or a non-gated mode by asserting or de-asserting gate signal 155. In the illustrated embodiment, in non-gated mode, control circuitry 140 is configured to de-assert gate signal 155 and MUX 160 selects ground for gate control signal 120, allowing power gated circuitry 130 to be powered through gating switch 110 from supply voltage $V_{DD}$.

In gated mode, in the illustrated embodiment, control circuitry 140 also generates a reference voltage 145 to control voltage regulator 150 in gated mode. In some embodiments, voltage regulator 150 generates overdrive voltage 165 based on reference voltage 145, e.g., to match reference voltage 145 in voltage level.

In gated mode, in the illustrated embodiment, control circuitry 140 is further configured to assert gate signal 155 and MUX 160 is configured to select an overdrive voltage 165 generated by voltage regulator 150 for gate control signal 120. In the illustrated embodiment, this switches off gating switch 110, leaving power gated circuitry 130 unpowered. Using overdrive voltage 165 rather than the supply voltage $V_{DD}$ to control gating switch 110 may significantly reduce leakage power in power gated circuitry 130 when it is not being used. In some embodiments, voltage regulator 150 may be omitted and circuit 100 may provide reference voltage 145 directly to gating switch 110 (e.g., via MUX 160 or otherwise). In the illustrated embodiment, however, voltage regulator 150 may output a voltage that matches voltage 145 with a greater amount of current than is available for reference voltage 145.

Note that the illustrated embodiment uses a p-type transistor to implement gating switch 110, but similar techniques may be used for other types of transistors in other embodiments. For example, similar techniques may be used for an n-type transistor located between power gated circuitry 130 and ground, or used with both n-type and p-type transistors for a power gated circuitry 130.

Asserting an overdrive voltage for gate control signal 120 at a greater voltage than the supply voltage $V_{DD}$ may substantially reduce subthreshold leakage current when operating gating switch 110 in gated mode. The reduction in subthreshold current leakage may be modeled as:

$$10\text{overdrive voltage–supply voltage/subthreshold slope}$$

where subthreshold slope is commonly in the range of 70 mV to 130 mV for CMOS transistors. However, there is also an N-well junction leakage that increases due the increase of the overdrive voltage beyond a certain level.

N-well junction leakage may also be described as gate-induced drain leakage (GIDL) and is caused by band-to-band and trap-assisted tunneling in the drain region under the gate. The sensitivity of the GIDL leakage to the overdrive voltage is typically stronger than the sensitivity of the subthreshold leakage. Therefore, increases in overdrive voltage after a certain limit will typically lead to an increase in overall switch leakage.

Therefore, in some embodiments, control circuitry 140 includes multiple replicas of gating switch 110 and is configured to select a value for reference voltage 145 based on a comparison of leakages of ones of the replicas.

Exemplary Replica Circuitry

FIG. 2 is a diagram illustrating exemplary control circuitry 200 configured to generate a reference voltage 145. In some embodiments, control circuitry 200 is included in control circuitry 140. In various embodiments, the reference voltage 145 is used to generate (or used as) an overdrive voltage to control one or more power switch circuit elements. In the illustrated embodiment, the control circuitry includes resistive elements 230A-230N, replica switches 212A-212N, load elements 240A-240N, comparison circuits 250A-250M, register 260, digital circuitry 270, and multiplexer (MUX) 290.

Resistive elements 230A-230N, in the illustrated embodiment, are arranged in a voltage ladder between a higher voltage rail and either a lower voltage rail (e.g., supply voltage $V_{DD}$ or some other voltage) or ground. In the illustrated embodiment, this produces multiple reference voltages 220A-220N at nodes between ones of the resistive elements. In some embodiments, resistive elements 230A-230N are resistors. In other embodiments, these elements may be implemented using any of various appropriate circuit elements such as transistors, for example. In some embodiments, voltage levels 220 at the different nodes are monotonically increasing in one direction (toward the higher voltage vail). In some embodiments, voltage levels at adjacent ones of reference voltages 220 are equidistant in voltage, but in other embodiments, any of various reference sets of reference voltage may be implemented. In some embodiments, the disclosed techniques work well with fairly low precision of resistivity in elements 230, e.g., because the precise value of the reference voltage is not as important as selecting the reference voltage in the set of reference voltages 220 that corresponds to the lowest leakage current in the corresponding replica switch 212, as discussed in further detail below.

Replica switches 212A-212N, in the illustrated embodiment, are powered by a supply voltage $V_{DD}$ and controlled by different ones of the reference voltages 220. The drain terminal of each replica is coupled to a respective load element 240 and one or more inputs to instances of comparison circuitry 250. Loads 240 may be sized to operate replicas 112 in the desired region of operation. Each replica may be much smaller in size than the corresponding power switch element(s) that are controlled based on reference voltage 145, e.g., in transistor area or terms of fins in FINFET implementations. Because they are controlled by different reference voltages, the different replicas will have different leakage currents at the drain terminal. In various embodiments, comparison circuitry 250 is configured to compare leakage currents of the replicas (directly or indirectly) and the output of the comparison circuitry 250 is used to select a reference voltage that corresponds to the replica with the lowest leakage current.

Comparison circuits 250A-M, in the illustrated embodiment, are each coupled to the drain terminals of two adjacent ones of the replica switches 212 and are voltage comparators configured to indicate which of its voltage is greater. This is one example of indirect measurement of leakage current. In other embodiments, leakage current may be measured directly, e.g., using current detectors and/or comparators. For example, current sensors may be used in place of load elements 240. In some embodiments, control circuitry 200 includes bit line current sense amplifiers (not shown) for leakage comparison and is configured to use the sense amplifiers to integrate currents at drain terminals over appropriate time intervals for comparison.

Register 260, in the illustrated embodiment, includes an entry (e.g., one bit) for each comparison circuit 250 that is configured to store its output.

Digital circuitry 270, in the illustrated embodiment, is configured to generate a select signal for MUX 290 based on the status of register 260. For example, consider an example implementation where a logical 1 in an entry indicates that the left-hand input of a comparison circuit 250 has a smaller leakage current than the right-hand side and register 260 is a 4-bit register with bits ABCD. In this example, a register value of 0011 would indicate that the replica switch 212 between the comparison circuits generating the B and C bits has the lowest leakage current and that its corresponding reference voltage should be selected as reference voltage 145. Speaking generally, the point in register 260 that separates a series of logical 1's from a series of logical 0's may correspond to the replica with the desired reference voltage.

In some embodiments, digital circuitry 270 may be implemented using relatively simply combinational circuitry such as exclusive-or (XOR) circuitry, for example. In other embodiments, digital circuitry 270 may include one or more filters (e.g., low-pass filters configured to remove high-frequency noise in the contents of register 260) to process changes to register 260. These filters may be implemented digitally, e.g., by periodically retrieving data from register 260 and averaging the results over multiple retrievals. Digital circuitry 270 may therefore be clocked, in these embodiments. In some embodiments, digital circuitry 270 is configured to handle unexpected register values such as 0101, for example, and make an appropriate selection for MUX 290 based on pre-determined selection outputs for such values.

MUX 290, in the illustrated embodiment, is configured to select one of the reference voltages 220 from the voltage ladder as reference voltage 145. As discussed above, reference voltage 145 may be used to control a voltage regulator that generates overdrive voltages to control one or more power switch circuits. Using reference voltage 145 may significantly reduce leakage current in gated modes, in various embodiments.

In various embodiments, using digital circuitry for various elements of FIG. 2 may facilitate implementation in integrated circuit designs where analog control circuitry may be undesirable, e.g. due to fabrication or area constraints, testability considerations, observability requirements, electrical noise issues, etc.

In various embodiments, appropriate numbers of replicas N may be selected to provide a desired granularity in available overdrive voltage values. In some embodiments, a greater number of replicas may be implemented than reference voltages, e.g., 2N where N is the number of reference voltages. This may reduce any problems relating to technology various among replicas, for example, by assigning multiple replicas to the same reference voltage and averaging their drain currents. In some embodiments, using a greater number of replicas may allow each replica to drive a single comparator, instead of some replicas driving multiple comparators as shown in FIG. 2.

Exemplary Buffer and Overdrive Enable Circuitry

FIG. 3 is a diagram illustrating exemplary buffering circuitry 300 configured to provide an overdrive voltage to a power switch. In the illustrated embodiment, the buffering circuitry 300 includes a select circuit 340 and a gating switch 110. In the illustrated embodiment, the buffering circuitry 300 is configured to receive a switch enable signal 320 and an overdrive enable signal 330. The switch enable signal 320 indicates whether to operating in gating mode or non-gating mode. The overdrive enable signal 330 indicates, in gating mode, whether to control gating switch 110 using the overdrive voltage rail 350 or the supply voltage $V_{DD}$. In some embodiments, a device is configured to initially enter a gating mode using the normal supply voltage to control gating switches (e.g., with overdrive enable 330 de-asserted) in order to lessen the initial power gating current load (the circuitry may have a large capacitance, so driving control terminals directly to the overdrive voltage may cause a greater current demand than driving these terminals to the supply voltage initially and then to the overdrive voltage). The device may then assert overdrive enable 330 in order to reduce leakage current after the gating mode has been entered.

Select circuitry, in the illustrated embodiment, includes thirteen transistors configured to select either supply voltage $V_{DD}$, ground, or a voltage from overdrive voltage rail 350 to provide as the voltage for gate control signal 120 based on switch enable signal 320 and overdrive enable signal 330. In the illustrated embodiment, transistors in select circuit 340 are doubled in order to reduce leakage current. In various embodiments, transistors may or may not be arranged in such a fashion.

In the illustrated embodiment, the buffer circuitry 300 is configured to send the switch enable signal 320 and overdrive enable signal 330 to another instance of buffer circuitry 300 in a daisy chain fashion. In some embodiments, overdrive enable signal 330 and portions of the circuitry shown in FIG. 3 may be omitted and gating switches may be immediately controlled using an overdrive voltage in gating mode. In some embodiments, select circuit 340 is also configured to provide gate control signal 120 to other power switching circuitry (not shown).

Gating switch 110, in the illustrated embodiment, is shown as implemented using multiple transistors 310A-310N to illustrate that the gating switch may be much greater in size (and have lower resistivity) relative to the replica switches 212 of FIG. 2. This is shown for illustrative purposes, however, and is not intended to limit the scope of gating switch 110. For example, in other embodiments, the replica switches 212 may be sized similarly to their corresponding power switch(es). In the illustrated embodiment, the drain terminals of transistors 310 are coupled to power gated circuitry such as circuitry 130.

In some embodiments, multiple instances of the circuitry shown in FIG. 2 are implemented in different portions of a circuit. This may allow for different overdrive voltages for switches in different parts of the chip, which may reduce overall power consumption by using different overdrive voltages that are most efficient in particular areas with different operating temperatures, for example. Further, a given instance of the circuitry shown in FIG. 2 may be used to generate an overdrive voltage level to drive multiple power gating switches.

These concepts are illustrated in FIG. 4, in which multiple instances of control circuitry with switch replicas 410A-410N are included in the same integrated circuit 400 and are configured to control separate respective voltage generators 420A-420N to each generate an overdrive control voltage used to control multiple power gating switches. In some embodiments, different gating switches may have different characteristics (e.g., supply voltages, sizes, etc.) and may have corresponding different replica circuitry.

Exemplary Method

Figure 5:
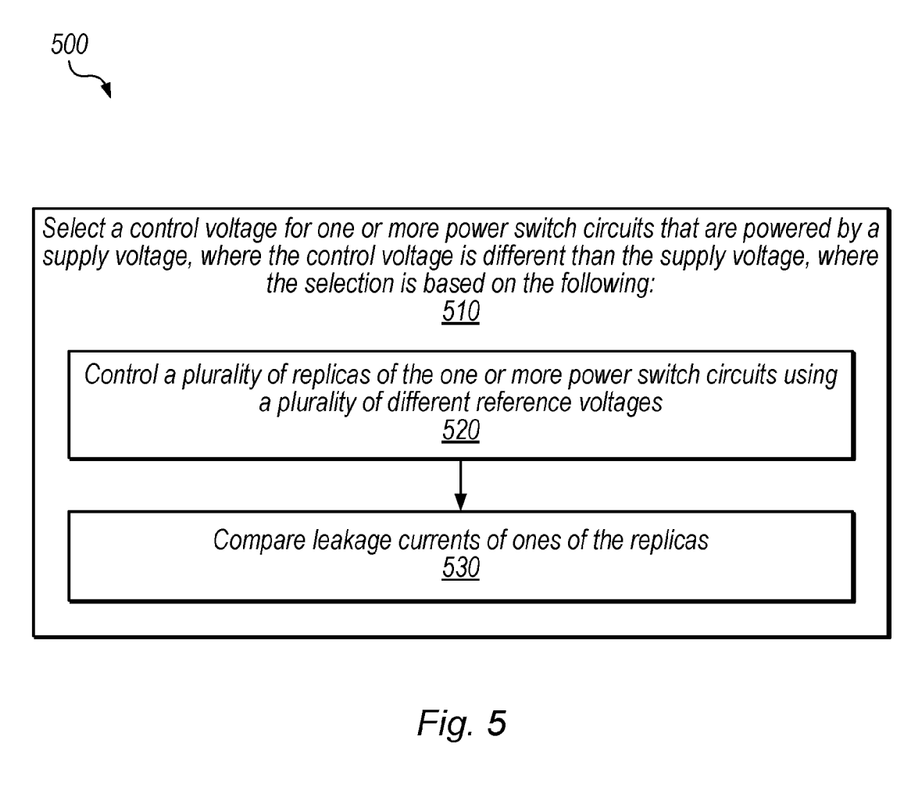
FIG. 5 is flow diagram illustrating one embodiment of a method for generating a control voltage for a power gating switch, according to some embodiments.

FIG. 5 is a flow diagram illustrating one exemplary embodiment of a method 500 for generating an overdrive voltage for power switch circuit elements. The method shown in FIG. 5 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired.

At 510, in the illustrated embodiment, control circuitry (e.g., digital circuitry 270 and MUX 290) selects a control voltage for one or more power switch circuits that are powered by a supply voltage. For example, gating switch 110 of FIG. 1 is powered by supply voltage $V_{DD}$ and controlled by gate control signal 120. In the illustrated embodiment, the control voltage is different than the supply voltage (e.g., greater than the supply voltage for p-type circuitry). In the illustrated embodiment, the selection is based on method elements 520 and 530.

At 520, in the illustrated embodiment, control circuitry (e.g., voltage ladder elements 230) controls a plurality of replicas of the one or more power switch circuits using a plurality of different reference voltages. For example, in FIG. 2, replica switches 212A-212N are controlled by asserting different reference voltages at their respective gate terminals.

At 530, in the illustrated embodiment, control circuitry (e.g., comparison circuits 250) compares leakage currents of ones of the replicas. As discussed above, leakage current may be measured or compared directly or may be measured or compared indirectly, e.g., using voltage sensors and/or voltage comparators.

In various embodiments, the disclosed techniques may reduce power consumption during power gating intervals by selecting efficient overdrive voltages for different circuits and/or circuit portions under various operating conditions. In various embodiments, the disclosed techniques may be performed using digital circuitry, which may be advantageous relative to analog techniques for generating overdrive voltages, in some implementations.

Exemplary Device

Figure 6:
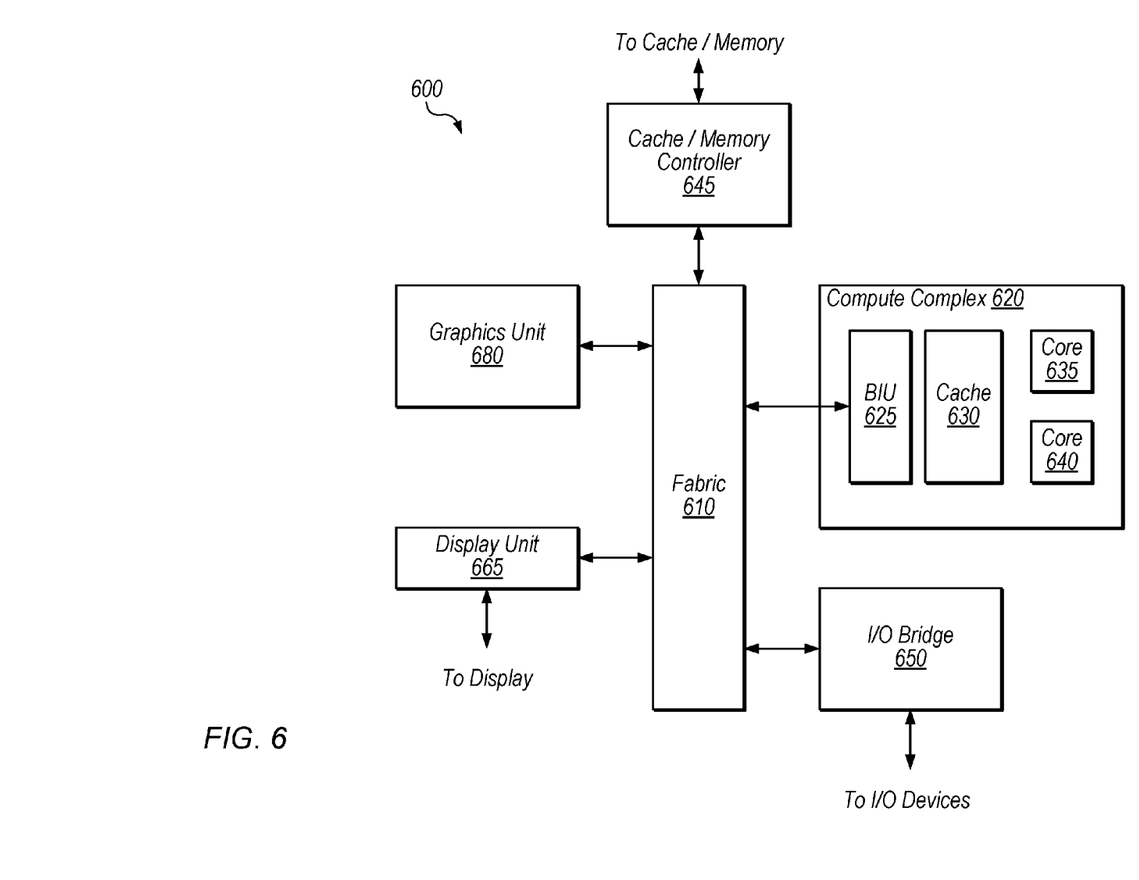
FIG. 6 is a block diagram illustrating an exemplary device, according to some embodiments.

Referring now to FIG. 6, a block diagram illustrating an exemplary embodiment of a device 600 is shown. In some embodiments, elements of device 600 may be included within a system on a chip. In some embodiments, device 600 may be included in a mobile device, which may be battery-powered. Therefore, power consumption by device 600 may be an important design consideration. In the illustrated embodiment, device 600 includes fabric 610, compute complex 620 input/output (I/O) bridge 650, cache/memory controller 645, graphics unit 680, and display unit 665. In some embodiments, device 600 may include other components (not shown) in addition to and/or in place of the illustrated components, such as video processor encoders and decoders, image processing or recognition elements, computer vision elements, etc.

Fabric 610 may include various interconnects, buses, MUX's, controllers, etc., and may be configured to facilitate communication between various elements of device 600. In some embodiments, portions of fabric 610 may be configured to implement various different communication protocols. In other embodiments, fabric 610 may implement a single communication protocol and elements coupled to fabric 610 may convert from the single communication protocol to other communication protocols internally.

In the illustrated embodiment, compute complex 620 includes bus interface unit (BIU) 625, cache 630, and cores 635 and 640. In various embodiments, compute complex 620 may include various numbers of processors, processor cores and/or caches. For example, compute complex 620 may include 1, 2, or 4 processor cores, or any other suitable number. In one embodiment, cache 630 is a set associative L2 cache. In some embodiments, cores 635 and/or 640 may include internal instruction and/or data caches. In some embodiments, a coherency unit (not shown) in fabric 610, cache 630, or elsewhere in device 600 may be configured to maintain coherency between various caches of device 600. BIU 625 may be configured to manage communication between compute complex 620 and other elements of device 600. Processor cores such as cores 635 and 640 may be configured to execute instructions of a particular instruction set architecture (ISA) which may include operating system instructions and user application instructions.

Cache/memory controller 645 may be configured to manage transfer of data between fabric 610 and one or more caches and/or memories. For example, cache/memory controller 645 may be coupled to an L3 cache, which may in turn be coupled to a system memory. In other embodiments, cache/memory controller 645 may be directly coupled to a memory. In some embodiments, cache/memory controller 645 may include one or more internal caches.

As used herein, the term "coupled to" may indicate one or more connections between elements, and a coupling may include intervening elements. For example, in FIG. 6, graphics unit 680 may be described as "coupled to" a memory through fabric 610 and cache/memory controller 645. In contrast, in the illustrated embodiment of FIG. 6, graphics unit 680 is "directly coupled" to fabric 610 because there are no intervening elements.

Graphics unit 680 may include one or more processors and/or one or more graphics processing units (GPU's). Graphics unit 680 may receive graphics-oriented instructions, such as OPENGL®, Metal, or DIRECT3D® instructions, for example. Graphics unit 680 may execute specialized GPU instructions or perform other operations based on the received graphics-oriented instructions. Graphics unit 680 may generally be configured to process large blocks of data in parallel and may build images in a frame buffer for output to a display. Graphics unit 680 may include transform, lighting, triangle, and/or rendering engines in one or more graphics processing pipelines. Graphics unit 680 may output pixel information for display images. In the some embodiments, graphics unit 680 includes a programmable shader core.

Display unit 665 may be configured to read data from a frame buffer and provide a stream of pixel values for display. Display unit 665 may be configured as a display pipeline in some embodiments. Additionally, display unit 665 may be configured to blend multiple frames to produce an output frame. Further, display unit 665 may include one or more interfaces (e.g., MIPI® or embedded display port (eDP)) for coupling to a user display (e.g., a touchscreen or an external display).

I/O bridge 650 may include various elements configured to implement: universal serial bus (USB) communications, security, audio, and/or low-power always-on functionality, for example. I/O bridge 650 may also include interfaces such as pulse-width modulation (PWM), general-purpose input/output (GPIO), serial peripheral interface (SPI), and/or inter-integrated circuit (I2C), for example. Various types of peripherals and devices may be coupled to device 600 via I/O bridge 650.

In some embodiments, various elements of device 600 may include power gating switches and corresponding control circuitry configured to gate power to various portions of device 600. The disclosed techniques may reduce power consumption by device 600, in various embodiments.

Exemplary Computer-Readable Medium

The present disclosure has described various exemplary circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 7:
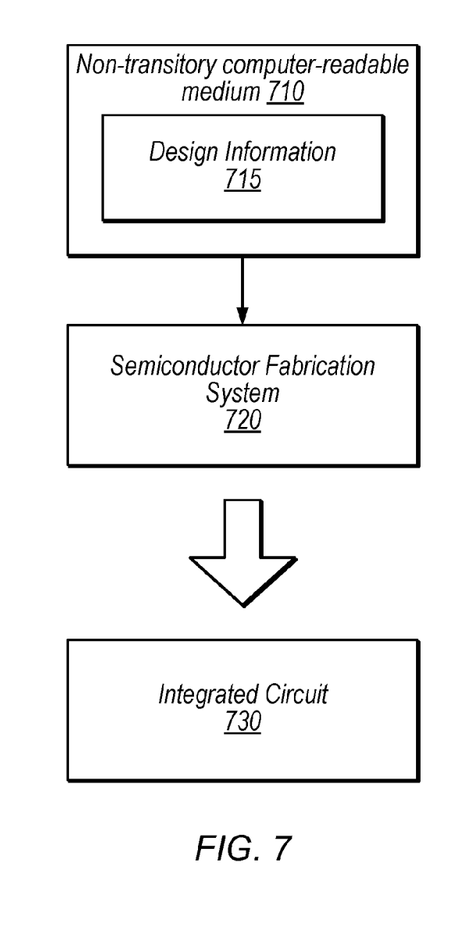
FIG. 7 is a block diagram illustrating an exemplary computer-readable medium, according to some embodiments.

FIG. 7 is a block diagram illustrating an exemplary non-transitory computer-readable storage medium that stores circuit design information, according to some embodiments. In the illustrated embodiment semiconductor fabrication system 720 is configured to process the design information 715 stored on non-transitory computer-readable medium 710 and fabricate integrated circuit 730 based on the design information 715.

Non-transitory computer-readable medium 710, may comprise any of various appropriate types of memory devices or storage devices. Medium 710 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Medium 710 may include other types of non-transitory memory as well or combinations thereof. Medium 710 may include two or more memory mediums which may reside in different locations, e.g., in different computer systems that are connected over a network.

Design information 715 may be specified using any of various appropriate computer languages, including hardware description languages such as, without limitation: VHDL, Verilog, SystemC, SystemVerilog, RHDL, M, MyHDL, etc. Design information 715 may be usable by semiconductor fabrication system 720 to fabrication at least a portion of integrated circuit 730. The format of design information 715 may be recognized by at least one semiconductor fabrication system 720. In some embodiments, design information 715 may also include one or more cell libraries which specify the synthesis and/or layout of integrated circuit 730. In some embodiments, the design information is specified in whole or in part in the form of a netlist that specifies cell library elements and their connectivity.

Semiconductor fabrication system 720 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 720 may also be configured to perform various testing of fabricated circuits for correct operation.

In various embodiments, integrated circuit 730 is configured to operate according to a circuit design specified by design information 715, which may include performing any of the functionality described herein. For example, integrated circuit 730 may include any of various elements shown in FIGS. 1, 2, 3, 4, and/or 6. Further, integrated circuit 730 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a power switch circuit element configured to gate power to circuitry in the apparatus based on a control signal, wherein the power switch circuit element is powered by a supply voltage; and
control circuitry configured to generate the control signal at a different voltage level than the supply voltage, wherein the control circuitry is configured to generate the voltage level of the control signal based on comparison of leakage currents of ones of a plurality of replicas of the power switch circuit element, wherein ones of the plurality of replicas include a control terminal and wherein the apparatus is configured to provide a first reference voltage to the control terminal of a first replica of the plurality of replicas and a second, different reference voltage to the control terminal of a second replica of the plurality of replicas.

2. The apparatus of claim 1, wherein the control circuitry includes digital logic circuitry configured to select one of the reference voltages based on the comparison.

3. The apparatus of claim 2, wherein the control circuitry includes a multiplexer configured to receive ones of the reference voltages, wherein the multiplexer is controlled by the digital logic circuitry.

4. The apparatus of claim 2, wherein the digital logic circuitry implements one or more digital low-pass filters.

5. The apparatus of claim 1, wherein the control circuitry is configured to select a reference voltage to the generate the voltage level of the control signal, wherein the control circuitry is configured to select the reference voltage corresponding to the one of the plurality of replicas with the lowest leakage current.

6. The apparatus of claim 1, wherein the control circuitry includes voltage comparison circuitry configured to compare voltage levels at terminals of respective ones of the replicas.

7. The apparatus of claim 1, wherein the control circuitry includes current comparison circuitry configured to generate comparison output signals based on direct comparison of leakage currents of ones of the replicas.

8. The apparatus of claim 1, further comprising a power supply configured to generate the control signal based on one of the different reference voltages.

9. The apparatus of claim 1, wherein the control circuitry includes voltage ladder circuitry configured to generate the reference voltages.

10. The apparatus of claim 1, wherein the apparatus is configured to use the voltage level for multiple power switch circuits in an integrated circuit region that includes the replicas.

11. The apparatus of claim 1, wherein the apparatus is configured to power gate circuitry coupled to the power switch circuit element by initially controlling the power switch circuit element into a gated mode using the supply voltage and subsequently controlling the power switch circuit element in the gated mode using the voltage level of the control signal.

12. A non-transitory computer readable storage medium having stored thereon design information that specifies a design of at least a portion of a hardware integrated circuit in a format recognized by a semiconductor fabrication system that is configured to use the design information to produce the circuit according to the design, including:
a power switch circuit element configured to gate power to a portion of the circuit based on a control signal, wherein the power switch circuit element is powered by a supply voltage; and
control circuitry configured to generate the control signal at a different voltage level than the supply voltage, wherein the voltage level of the control signal is based on comparison of leakage currents of ones of a plurality of replicas of the power switch circuit element, ones of the plurality of replicas include a control terminal and wherein the circuit is configured to provide a first reference voltage to the control terminal of a first replica of the plurality of replicas and a second, different reference voltage to the control terminal of a second replica of the plurality of replicas.

13. The non-transitory computer readable storage medium of claim 12, wherein the design information specifies that the control circuitry includes digital logic circuitry configured to select one of the reference voltages based on the comparison.

14. The non-transitory computer readable storage medium of claim 13, wherein the digital logic circuitry implements one or more filters on outputs of the comparison.

15. The non-transitory computer readable storage medium of claim 12, wherein the design information specifies that the control circuitry includes voltage ladder circuitry configured to generate the reference voltages.

16. The non-transitory computer readable storage medium of claim 12, wherein the design information specifies that the circuit is configured to use the voltage level for multiple power switch circuits in region of the circuit.

17. The non-transitory computer readable storage medium of claim 12, wherein the circuit is configured to power gate the portion of the circuit by initially controlling the power switch circuit element off using the supply voltage and subsequently controlling the power switch circuit element off using the voltage level of the control signal.

18. A method, comprising:
selecting a control voltage for one or more power switch circuits that are powered by a supply voltage, wherein the control voltage is different than the supply voltage, based on:
controlling a plurality of replicas of the one or more power switch circuits, wherein ones of the replicas include a control terminal and wherein the controlling includes providing different reference voltages to the respective control terminal of different ones of the replicas; and
comparing leakage currents of ones of the replicas.

19. The method of claim 18, further comprising selecting one of the different reference voltages as the control voltage based on the comparing.

20. The method of claim 18, wherein the comparing is performed by comparing voltages at drain terminals of ones of the replicas.

* * * * *